(12) United States Patent
Yates et al.

(10) Patent No.: US 7,016,041 B2
(45) Date of Patent: Mar. 21, 2006

(54) RETICLE OVERLAY CORRECTION

(75) Inventors: Colin D. Yates, Clackamas, OR (US); James R. B. Elmer, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 331 days.

(21) Appl. No.: 10/236,226

(22) Filed: Sep. 6, 2002

(65) Prior Publication Data

US 2004/0046961 A1 Mar. 11, 2004

(51) Int. Cl.
 *G01B 11/00* (2006.01)
(52) U.S. Cl. .................................................. 356/401
(58) Field of Classification Search ........ 356/400–401; 430/5, 22, 30
See application file for complete search history.

(56) References Cited

U.S. PATENT DOCUMENTS

| | | | | |
|---|---|---|---|---|
| 6,023,338 | A * | 2/2000 | Bareket | 356/401 |
| 6,204,912 | B1 * | 3/2001 | Tsuchiya et al. | 355/53 |
| 6,362,491 | B1 * | 3/2002 | Wang et al. | 250/548 |
| 2002/0105649 | A1 * | 8/2002 | Smith et al. | 356/401 |
| 2004/0002011 | A1 * | 1/2004 | Laughery et al. | 430/22 |

* cited by examiner

*Primary Examiner*—Michael P. Stafira
(74) *Attorney, Agent, or Firm*—Luedeka, Neely & Graham, P.C.

(57) ABSTRACT

A method for characterizing overlay errors between at least a first and a second mask layer for an integrated circuit. A first primary alignment structure is formed in a first position of the inter-layer region around the first mask layer, and a first secondary alignment structure is formed in a second position of the inter-layer region around the first mask layer. Similarly, a second primary alignment structure is formed in a first position of an inter-layer region around the second mask layer, and a second secondary alignment structure is formed in a second position of the inter-layer region around the second mask layer. The first mask layer and the second mask layer are exposed onto a photoresist coated substrate with a first exposure and a second exposure, where the first position of the first primary alignment structure during the first exposure generally aligns with the second position of the second secondary alignment structure, and the second position of the first secondary alignment structure during the second exposure generally aligns with the first position of the second primary alignment structure. The photoresist on the substrate is developed, and offsets between the first primary alignment structure and the second secondary alignment structure are measured, and offsets between the second primary alignment structure and the first secondary alignment structure are also measured, to determine the overlay errors.

20 Claims, 6 Drawing Sheets

46

RETICLE OVERLAY CORRECTION

FIELD

This invention relates to the field of integrated circuit fabrication. More particularly, this invention relates to reticle design, characterization, and use.

BACKGROUND

Integrated circuits are currently fabricated in a series of process steps whereby a given layer is formed, patterned, and modified, and then subsequent layers are formed on top of the given layer until the fabrication of the integrated circuit is complete. For example, a layer of an electrically insulating material may be formed over the top of a layer of an electrically conducting material, and then patterned to define areas where openings will be formed in the electrically insulating layer, and then modified to create the openings through the electrically insulating layer and down to the electrically conducting layer. This iterative process of forming, patterning, and modifying a layer is repeated many times during the fabrication of an integrated circuit. Of course, there are many extremely complex modifications to and variations of this very basic description as presented, but this description is sufficient to introduce the concepts that are described in association with the invention disclosed and claimed herein.

As a part of the process whereby the layer is patterned, a layer of a photosensitive material, or photoresist, is applied to the surface of the layer in a process such as spin coating. The photoresist is soft baked to remove some of the more volatile components and form a film that has sufficient structural properties for the subsequent use of the film. The photoresist is then exposed to a pattern that is created by passing a light through a mask of some type, in which the pattern has been previously formed. The photoresist is then hard baked to further drive out the volatile components, and the layer underlying the patterned photoresist film is then modified, such as in an etching process.

The mask that is used in the exposure process may have any one of several different forms. For example, the mask may be large enough to cover in a single exposure the entire surface of the substrate on which the integrated circuits are to be formed. In this case, the mask has approximately the same number of integrated circuits within its pattern as are ultimately formed on the substrate.

However, as substrate sizes have increased, this configuration has become less favored. Typically, the mask has fewer device patterns on it than will ultimately be formed on the surface of the substrate, and the images on the mask are stepped across the surface of the substrate in a series of multiple exposures onto subsections of the substrate, until the entire surface of the substrate has been exposed to the images on the mask. For example, the mask may have a block of nine integrated circuit images on it, which are stepped across the surface of the substrate. Masks with properties such as those described herein are typically referred to as reticles.

Typically, just the images for a single mask layer are contained on a single reticle. Thus, if an integrated circuit requires nine different layers, nine different reticles are required for the fabrication of the integrated circuit, and if the integrated circuit requires eighteen different layers, then eighteen different reticles are required for the fabrication of the integrated circuit. As the cost of constructing a reticle has increased dramatically, there has been incentive to find ways to reduce the number of reticles required to fabricate a given integrated circuit pattern.

One method that has been used is to put more than one mask layer on a single reticle. For example, for a reticle with a block of nine images on it, instead of making each of the images in the block of nine the same image, some of the images can be for different mask layers. For example, the top row of three images may be for a first masking layer, the second row of three images may be for a second masking layer, and the third row of three images may be for a third masking layer. As a further example, the nine images may be for nine different masking layers. In this example, if the integrated circuit has only nine masking layers, then only a single reticle is required, and if the integrated circuit has eighteen masking layers, then only two different reticles are required.

In this manner, the number of reticles required to pattern an integrated circuit design is dramatically reduced. However, there are certain other issues that are created with this solution. For example, the throughput of the exposure process tends to be reduced in direct proportion to the decrease in the number of redundant images for a single masking layer on a reticle. In other words, a reticle that contains nine images for a single masking layer has nine times the throughput of a reticle that contains only one image for a single masking layer.

Another issue that is created has to do with the physical properties of the plate on which the patterned images of the reticle are formed, and the physical properties of the lenses and other optics used to transmit the light through the reticle and to the surface of the substrate on which the integrated circuits are to be formed. Because both the plate and the optics tend to have some degree of non-uniformity in their physical properties, an image that formed from one part of the reticle and optics may not be exactly the same as an image that is formed from another part of the reticle and optics.

When a reticle contains a set of only one image, and the set is stepped across the surface of the substrate in a uniform manner from masking layer to masking layer, then individual integrated circuits on the substrate are patterned from images that all originate in the same part of each reticle, and with light that is transmitted through the same part of the optics. Thus, these non-uniformities in physical characteristics tend to not be such a problem in this case.

However, when a reticle has different images within its image set, then a single integrated circuit is formed with images that are originated in different portions of the reticle and through different portions of the optics. These differences in physical characteristics from one position to another may be large enough to create misalignment and other problems between the different layers of the integrated circuit so formed. This problem is called reticle overlay error.

What is needed, therefore, is a system for characterizing and correcting reticle overlay errors.

SUMMARY

The above and other needs are met by a method for characterizing overlay errors between at least a first and a second mask layer for an integrated circuit. Alignment measurement structures are placed in the regions of the reticle between integrated circuit masking layers. These inter-layer regions of the reticle are typically not intended to print onto a substrate during integrated circuit fabrication. A first primary alignment structure is formed in a first position of an inter-layer region of the first mask layer, and a first secondary alignment structure is formed in a second position of the inter-layer region of the first mask layer. Similarly, a second primary alignment structure is formed in a first position of an inter-layer region of the second mask layer, and a second secondary alignment structure is formed in a second position of the inter-layer region of the second mask layer. The first mask layer and the second mask layer are exposed onto a photoresist coated substrate with a first exposure and a second exposure, where the first position of the first primary alignment structure during the first exposure generally aligns with the second position of the second secondary alignment structure, and the second position of the first secondary alignment structure during the second exposure generally aligns with the first position of the second primary alignment structure. The photoresist on the substrate is developed, and offsets between the first primary alignment structure and the second secondary alignment structure are measured, and offsets between the second primary alignment structure and the first secondary alignment structure are also measured, to determine the overlay error.

By having the alignment overlay characterization structures in the inter-layer regions of the reticle, no additional space is required inside of the mask layers for the structures. Further, the same characterization structure designs can be used for all mask sets, rather than having specially designed structures that meet competing design goals for different mask sets. Additionally, the overlay errors can be measured between all different mask layers on a reticle. Furthermore, a special test reticle does not need to be created to characterize the overlay errors, rather a production reticle can be used, which helps reduce expenses.

In various preferred embodiments, the overlay errors for more than two mask layers are characterized. The first and second mask layers are preferably disposed on a common mask substrate, and most preferably the alignment structures are dark field structures. In a preferred embodiment, the first primary alignment structure and the second primary alignment structure comprise outer box structures, and the first secondary alignment structure and the second secondary alignment structure comprise inner box structures. Preferably, the first positions of the scribe line areas of the first mask layer and the second mask layer comprise four positions each near corners of each of the first mask layer and the second mask layer. The second positions of the scribe line areas of the first mask layer and the second mask layer are preferably four positions each near corners of each of the first mask layer and the second mask layer.

The first exposure of the first mask layer and the second mask layer is preferably accomplished by exposing the first mask layer and the second mask layer with a stepper having exposure site blades, where the exposure site blades are in a position allowing both the first mask layer and the scribe line area of the first mask layer, and the second mask layer and the scribe line area of the second mask layer to be exposed onto the substrate. The second exposure of the first mask layer and the second mask layer is then preferably accomplished by stepping the first mask layer and the second mask layer one position and exposing the first mask layer and the second mask layer onto the substrate on top of each other. In a most preferred embodiment, the overlay errors are used to correct future exposures of the first mask layer and the second mask layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
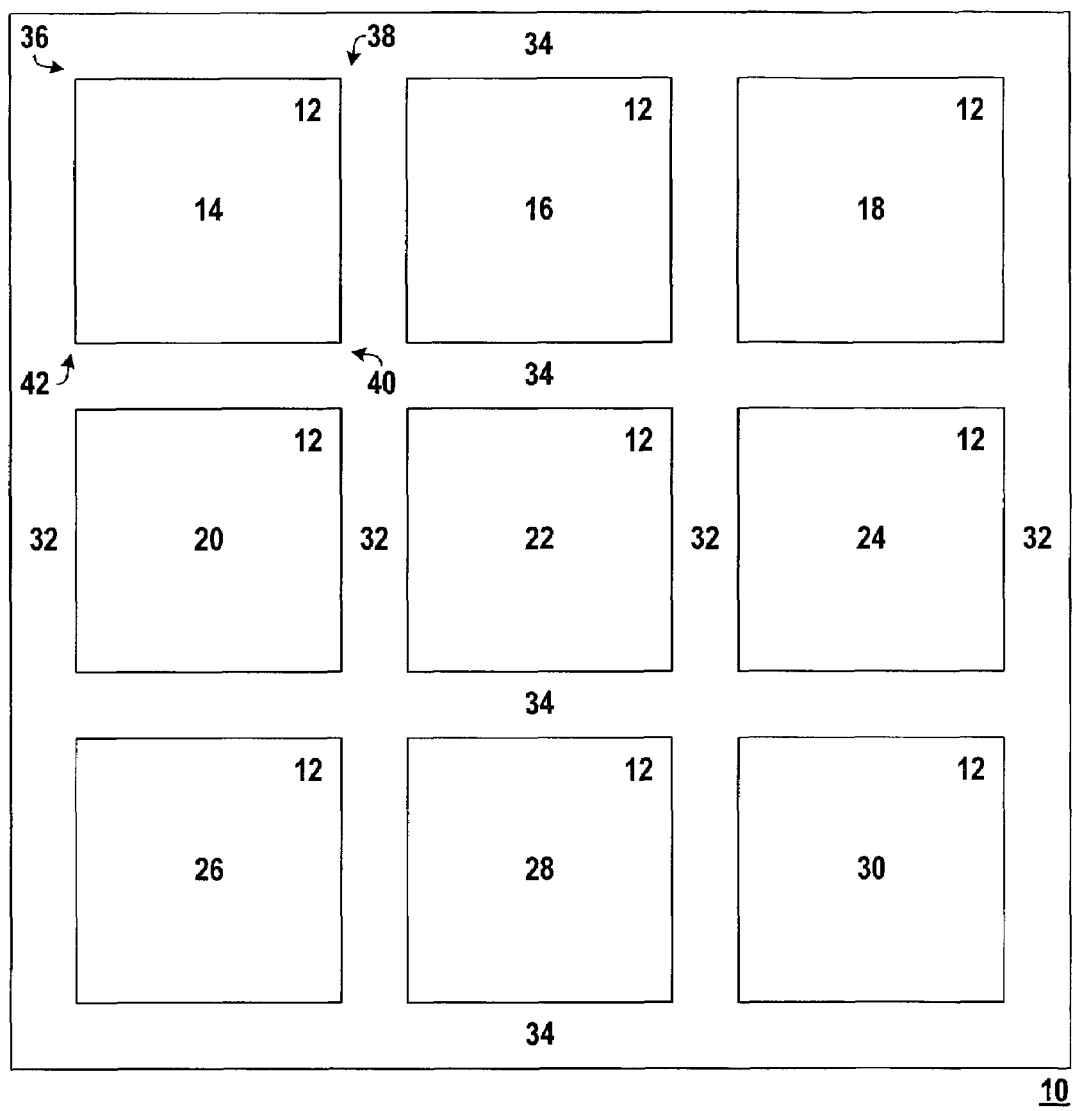
FIG. 1 is a top plan view of a reticle according to a preferred embodiment of the present invention.

With reference now to FIG. 1, there is depicted a top plan view of a reticle 10 according to a preferred embodiment of the present invention. The reticle 10 includes a number of different mask layers 12, which in the embodiment depicted total nine in number. However, it is appreciated that this number of mask layers 12 is representative only, and that in actual implementation the number of mask layers 12 may be any number from two mask layers and up, depending upon other constraints as dictated by typical reticle fabrication.

The individual mask layers 12 are separated by vertical inter-layer regions 32 and horizontal inter-layer regions 34. The inter-layer regions 32 and 34 may be of varying widths, as known in the art. Traditionally, there is nothing in the inter-layer regions 32 and 34 which is used during the imaging of an integrated circuit. If the mask layers 12 are all different mask layers, then the reticle blades of the stepper used to image the integrated circuit are closed to the very edges of the individual mask layer 12 being printed, so that the inter-layer regions 32 and 34 do not print on the integrated circuit substrate.

In the embodiment depicted in FIG. 1, there is a first mask layer 14, a second mask layer 16, and additional mask layers 12 through a ninth mask layer 30. Each of the mask layers 12 have four corner areas 36, 38, 40, and 42, which are identified for the first mask layer 14, but which are not labeled for the second mask layer 16 and subsequent mask layers 12, as the concept is one that is easily understood.

As mentioned above, in the preferred embodiment all of the mask layers 12 are different mask layers. However, in alternate embodiments, there may be two each of several different mask layers 12 on the reticle 10, or three each of several different mask layers 12 on the reticle 10, or two of one mask layer 12 and several of another mask layer 12 on the reticle 10. Thus, many different combinations of the number of different mask layers 12 and number of redundant mask layers 12 are comprehended by the present invention, which is not limited by such different combinations.

Figure 2:
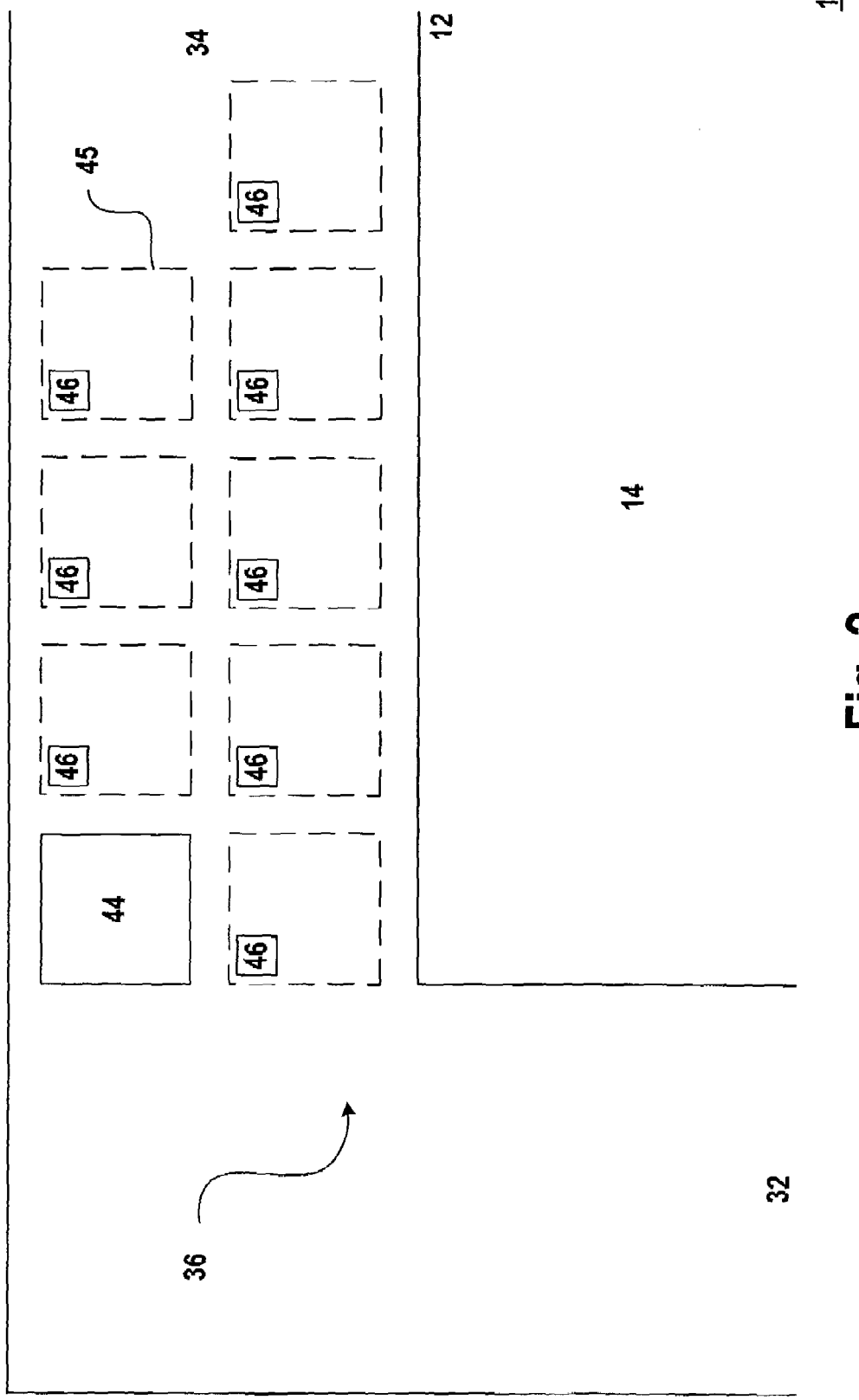
FIG. 2 is a top plan view of alignment structures in the scribe line of a first mask layer.

FIG. 2 is a top plan view of alignment structures 44 and 46 in the inter-layer region 34 of the first mask layer 14, which alignment structures 44 and 46 are generally disposed in the corner area 36 of the first mask layer 14. Preferably, similar alignment structures 44 and 46 are disposed in the other three corner areas 38, 40, and 42 of the first mask layer 14, and in the corresponding corner areas of the other mask layers 12 on the reticle 10. However, depictions of the alignment structures 44 and 46 are not given for the other corner areas of the first mask layer 14, or for the other mask layers 12 except as specifically mentioned below, so as to reduce the amount of redundant information in this disclosure, and focus more specifically on concepts requiring more explanation.

The alignment structure 44 is designated as a primary alignment structure 44 herein, and because it is associated with the first mask layer 14, it is more completely referred to as the first primary alignment structure 44. Corresponding alignment structures for other mask layers 12 are referred to as the second primary alignment structure, the third primary alignment structure, and so on. As mentioned above, the first mask layer 14 preferably has at least one, and most preferably exactly one, primary alignment structure 44 in each of the corner areas 36, 38, 40, and 42. Similarly, each of the other mask layers 12 on the reticle 10 also preferably have at least one, and most preferably exactly one, primary alignment structure in each of their respective corner areas 36, 38, 40, and 42. However, the primary alignment structures for different mask layers 12 on the reticle 10 preferably differ to some extent, as described in more detail below.

Additionally, there are a number of secondary alignment structures 46 in each of the corner areas 36, 38, 40, and 42 of the first mask layer 14. Similar to that as described above, there are preferably secondary alignment structures in each of the respective corner areas 36, 38, 40, and 42 of the first mask layer 14, and the other mask layers 12 on the reticle 10. Again, the secondary alignment structures for each of the different mask layers 12 on the reticle 10 preferably differ to some extent, again as described in more detail below.

The first secondary alignment structures 46, as depicted in FIG. 2, are disposed in specific locations that are designed to carefully align with the primary alignment structures for other mask layers 12 on the reticle 10, and most preferably all of the primary alignment structures for all of the other mask layers 12 on the reticle 10, when the mask layers 12 are stepped across the surface of a substrate in multiple exposures. Thus, boxes 45 in FIG. 1 depict in phantom the locations where the other primary alignment structures for the other mask layers 12 on the reticle 10 will preferably print on the substrate when it is exposed using the reticle 10 according to a preferred embodiment of the invention.

According to the present invention, the reticle 10 is used by opening up the reticle blades on the stepper wide enough to preferably expose all of the mask layers 12 on the reticle 10, including all of the primary and secondary alignment structures associated with each of the mask layers 12 in the scribe lines 32 and 34, and exposing all of the mask layers 12 and alignment structures on the surface of the substrate in a first exposure. The reticle 10 is then logically indexed by a single mask layer 12 either horizontally or vertically, and the entire reticle 10 as describe above is then again exposed on the surface of the substrate in a second exposure. This process of exposing and then shifting one make layer 12 is repeated until the substrate has preferably been substantially completely exposed and, more importantly, at least one image of all of the mask layers 12 on the reticle 10 have been exposed over the top of at least one image of all of the other mask layers 12 on the reticle 10.

Thus, there are distinctions between the method as described above and the standard use of a reticle 10. For example, in standard practice, when there are multiple different masking layers 12 on a reticle 10, the reticle blades are closed so as to expose a single mask layer 12, which is then stepped across the surface of the substrate in a series of exposures. However, in the preferred method of the present invention, the reticle blades are opened so that all of the different mask layers 12 on the reticle 10 are exposed across the surface of the substrate in a series of exposures.

Further, in standard practice, when several mask images on a reticle are exposed with a first exposure, such as when each of the several exposed mask images is for the same mask layer, the reticle 10 is stepped a distance equal to all of the exposed mask images, so that they do not over print each other. Thus, in such an arrangement, the multiple identical mask images are used to increase through put. However, in the preferred method of the present invention, the several mask layers 12 are exposed in a first exposure but then stepped a distance of only one of the mask layers 12, so that in the second and subsequent exposures, the different mask layers 12 over print one another. The significance of this preferred method is described in more detail below.

Figure 3:
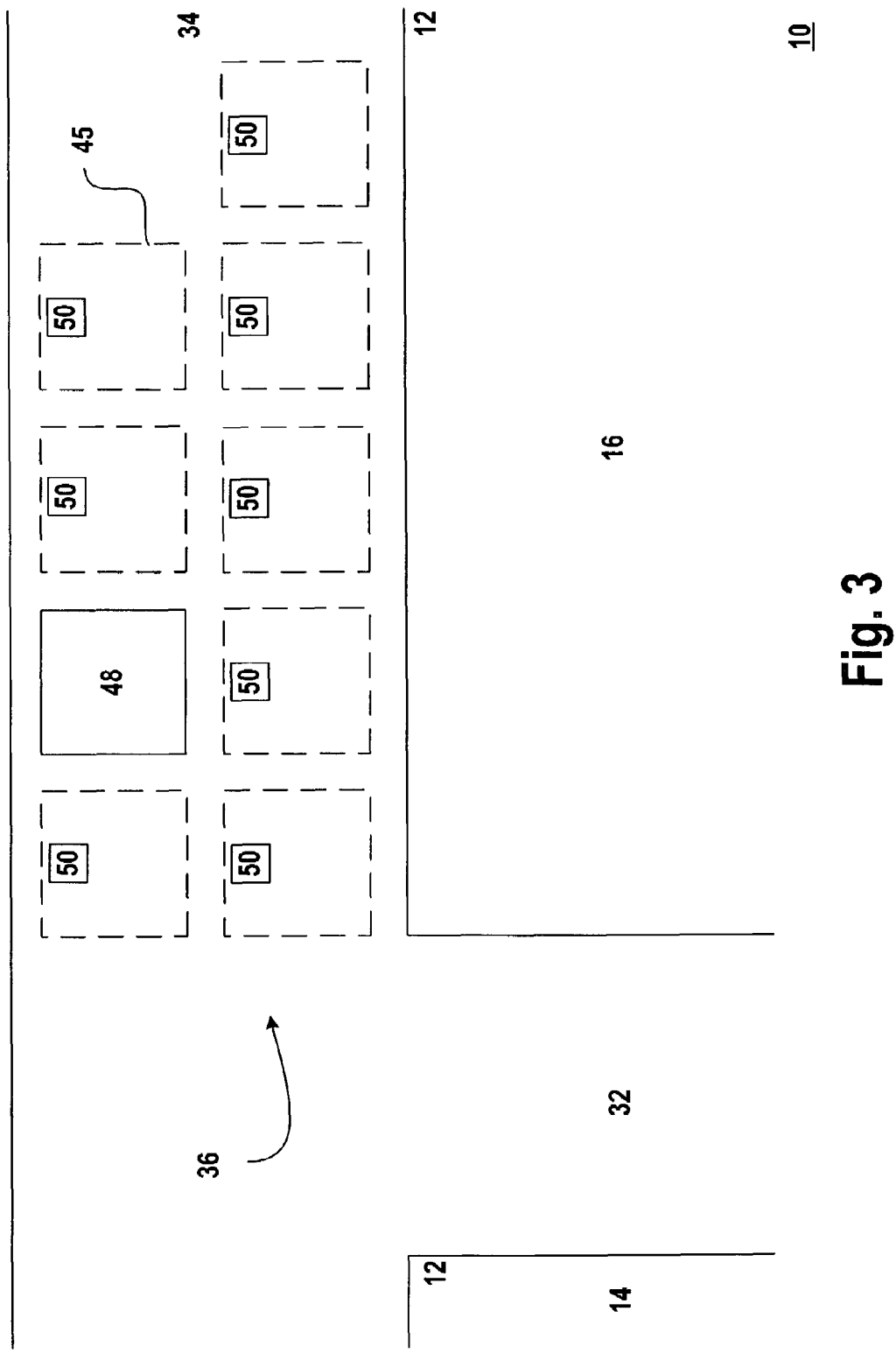
FIG. 3 is a top plan view of alignment structures in the scribe line of a second mask layer.

With reference now to FIG. 3, there is depicted a top plan view of alignment structures 48 and 50 in the scribe line 34 of a second mask layer 16, which in the embodiment depicted is immediately to the right of the first mask layer 14. Similar to that as described above for the first mask layer 14, alignment structures 48 and 50 are generally disposed in the corner area 36 of the second mask layer 16. Preferably, similar alignment structures 48 and 50 are disposed in the other three corner areas 38, 40, and 42 of the second mask layer 16, as briefly referred to above.

The alignment structure 48 is more completely referred to as the second primary alignment structure 48, in keeping with the naming convention described above. Additionally, there are a number of secondary alignment structures 50 in each of the corner areas 36, 38, 40, and 42 of the second mask layer 16. Similar to that as described above, the second secondary alignment structures 50, as depicted in FIG. 3, are disposed in specific locations that are designed to carefully align with the primary alignment structures for other mask layers 12 on the reticle 10, and most preferably all of the primary alignment structures for al of the other mask layers 12 on the reticle 10, as the images are repeatedly indexed and exposed across the surface of the substrate. Thus, boxes 45 in FIG. 3 depict in phantom the locations where the other primary alignment structures for the other mask layers 12 on the reticle 10 will preferably print on a substrate that is exposed using the reticle 10 according to a preferred embodiment of the invention.

Therefore, at this point in the description it should be well understood that each of the different mask layers 12 have both primary and secondary alignment structures in each of their corner areas, and that primary alignment structures for each mask layer 12 are aligned with the secondary alignment structures for each of the other mask layers 12 on the reticle as the reticle is stepped across the surface of the substrate in multiple exposures.

Figure 4:
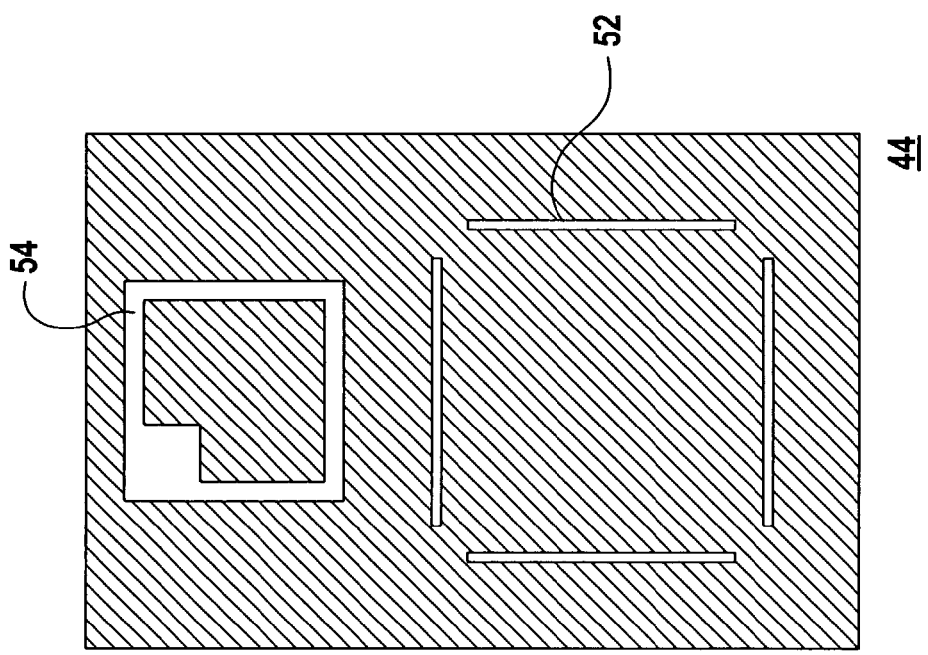
FIG. 4 is a top plan view of a primary alignment structure for a first mask layer.

FIG. 4 depicts a top plan view of one cell of a primary alignment structure, which in the example depicted is the first primary alignment structure 44. The primary alignment structure 44 is preferably comprised of two different parts, being a primary structure identification image 54, and a primary box alignment structure 52.

In the example depicted, the primary structure identification image 54 is useful for determining the mask image 12 to which the primary alignment structure 44 relates. In this example, this identification is made by placing a large box in the primary structure identification image 54, in a location that represents where the associated mask image is located on the reticle 10. In this example, the large box is placed in the upper left hand corner of the primary structure identification image 54, which indicates that this primary alignment structure is associated with the mask image 12 in the upper left hand corner of the reticle 10, which in this example is the first mask layer 14. It is appreciated that other methods of designating the mask layer 12 with which the primary alignment structure is associated could also be used, such as having a number in this portion of the primary alignment structure.

Figure 8:
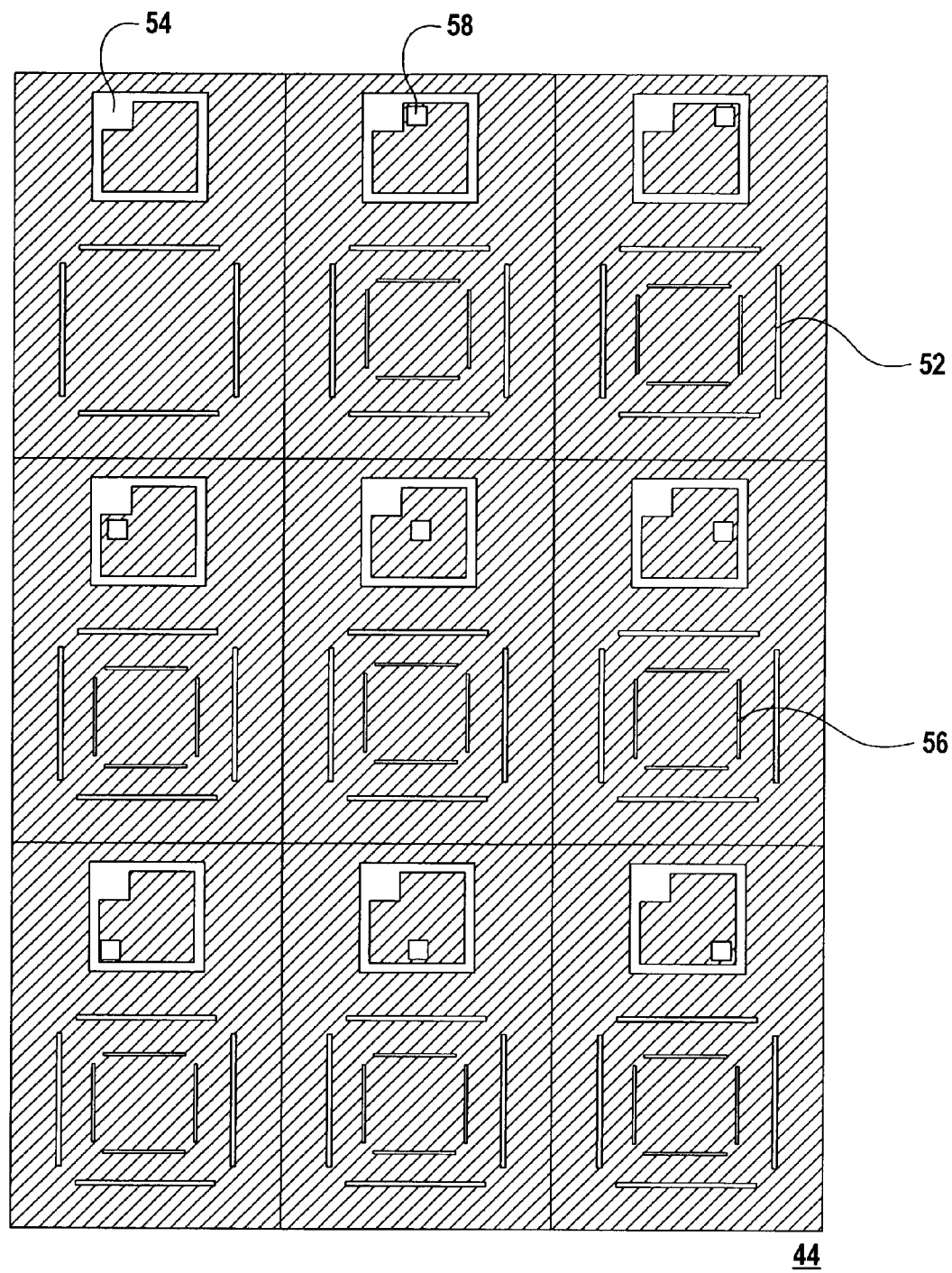
FIG. 8 is a top plan view of primary alignment structures for a first mask layer that have been overlaid with secondary alignment structures for second through ninth mask layers.

The primary box alignment structure 52 as depicted is an outer box structure, however, in various embodiments the primary box alignment structure 52 may have any one or more of a variety of different configurations, and need not be a box structure at all. The purpose of the primary box alignment structure 52 is to form a structure that can be compared with secondary box alignment structures, as describe in more detail hereafter. Preferably, the complete primary alignment structure 44 contains several of the cell patterns as depicted in FIG. 4, most preferably the primary alignment structure 44 contains the same number of cell patterns as depicted in FIG. 4 as there are mask layers 12 on the reticle 10, such as is depicted in FIG. 8.

Figure 5:
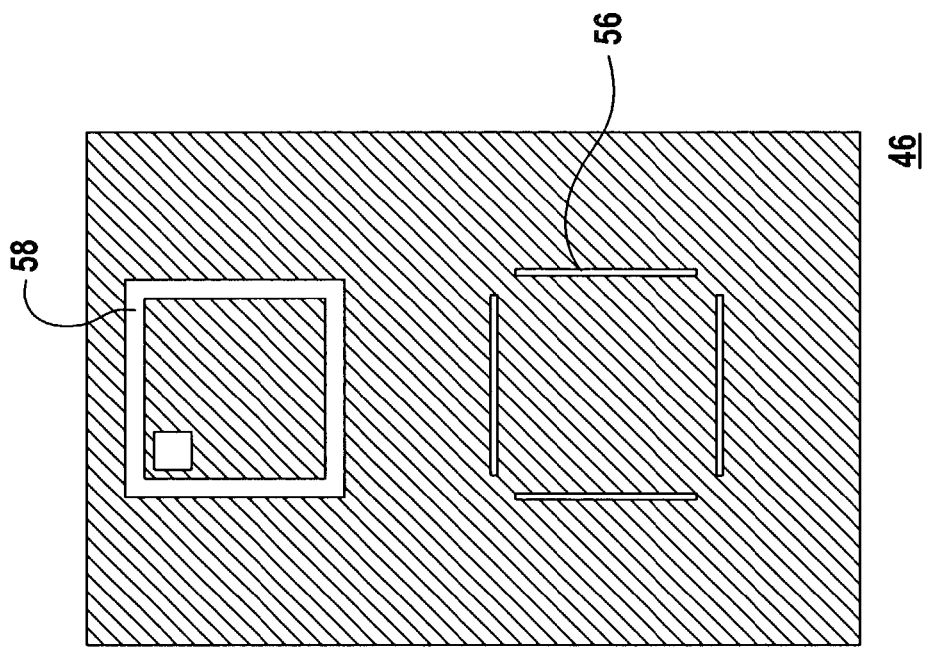
FIG. 5 is a top plan view of a secondary alignment structure for a first mask layer.

FIG. 5 depicts a top plan view of a secondary alignment structure, which in the example depicted is the first secondary alignment structure 46. The secondary alignment structure 46 is preferably comprised of two different parts, being a secondary structure identification image 58, and a secondary box alignment structure 56.

In the example depicted, the secondary structure identification image 58 is useful for determining the mask image 12 to which the secondary alignment structure 46 relates. In this example, this identification is made by placing a small box in the secondary structure identification image 58, in a location that represents where the associated mask image is located on the reticle 10. In this example, the small box is placed in the upper left hand corner of the secondary structure identification image, which indicates that this secondary alignment structure is associated with the mask image 12 in the upper left hand corner of the reticle 10, which in this example is the first mask layer 14. It is appreciated that other methods of designating the mask layer 12 with which the secondary alignment structure is associated could also be used, such as having a number in this portion of the secondary alignment structure.

The secondary box alignment structure 56 as depicted is an inner box structure, however, in various embodiments the secondary box alignment structure 56 may have any one or more of a variety of different configurations, and need not be a box structure at all. The purpose of the secondary box alignment structure 56 is to form a structure that can be compared with primary box alignment structures, as describe in more detail hereafter.

Figure 7:
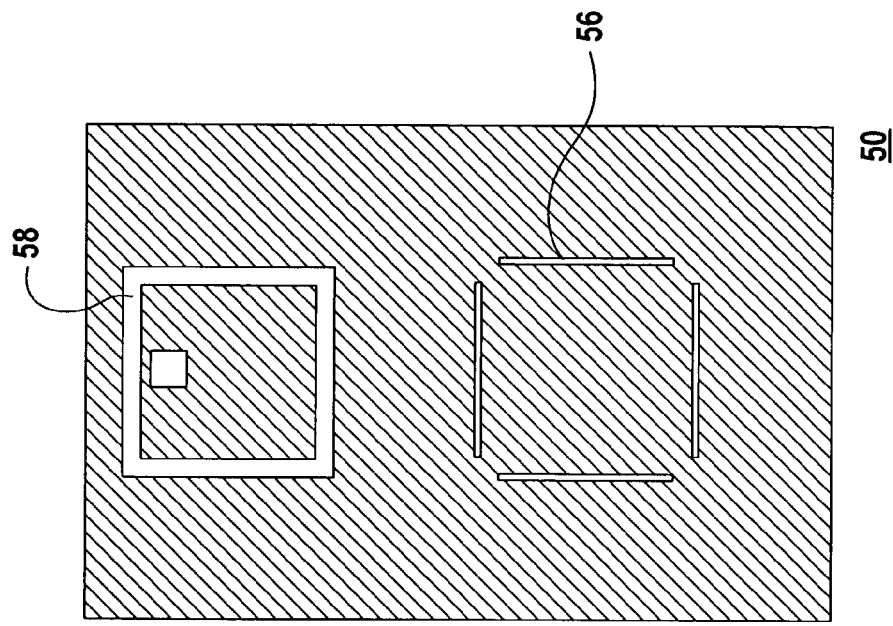
FIG. 7 is a top plan view of a secondary alignment structure for a second mask layer.
Figure 6:
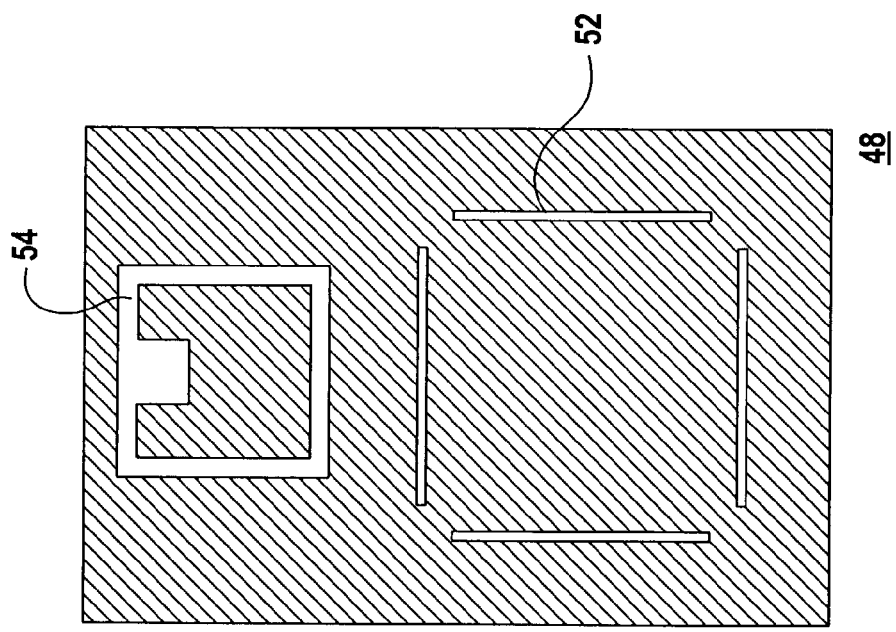
FIG. 6 is a top plan view of a primary alignment structure for a second mask layer.

So as to completely understand the preferred embodiment of the invention, FIGS. 6 and 7 depict the second primary alignment structure 48 and the second secondary alignment structure 50, respectively. FIG. 6 depicts a top plan view of one cell of a primary alignment structure, which in the example depicted is the second primary alignment structure 48. As before, the primary structure identification image 54 specifies the mask image 12 to which the primary alignment structure 48 relates, which in this example is the mask image 12 in the upper center of the reticle 10, which is the second mask layer 16. The primary box alignment structure 52 as depicted is an outer box structure, as before.

FIG. 7 depicts a top plan view of a secondary alignment structure, which in the example depicted is the second secondary alignment structure 46. In this example, the small box is placed in the upper center of the secondary structure identification image 58, which indicates that this secondary alignment structure is associated with the mask image 12 in the upper center of the reticle 10, which is the second mask layer 16. As before, the secondary box alignment structure 56 as depicted is an inner box structure. Primary and secondary alignment structures for other mask layers are preferably designed according to the design criteria as specified by the above examples.

FIG. 8 is a top plan view of the primary alignment structure 44 for the first mask layer 14, that has been overlaid with secondary alignment structures for second through ninth mask layers. Thus, at the end of the process as described above, each of the different mask layers 12 will have a series of structures such as depicted in FIG. 8, at each of their respective four corner areas 36, 38, 40, and 42. The overlaid alignment structures at each of the different mask layers 12 will differ somewhat, in that they will have different primary structures that relate to the specific mask layer 12 with which they are associated, but all will have the general appearance and functionality as depicted in FIG. 8, which is the first primary alignment structure 44 that has been over printed with the secondary alignment structures for the second through ninth masks 12 on the reticle 10, in the manner as described above.

Thus, the primary structure identification image 54 in each cell of the primary alignment structure 44 designates the first mask layer 14 as being the primary mask layer 12 for this alignment structure overlay. As depicted, there is a separate cell of the primary alignment structure 44 for each of the other mask layers 12. For example, the secondary structure identification image 58 indicates which of the primary alignment cells for the first mask layer 14 has been aligned with the secondary alignment structure 50 for the second mask layer 16. Similarly, each cell of the primary alignment structure 44 has an outer box structure 52, in which there is also printed an inner box alignment structure 56 that is associated with the mask layer 12 designated by the secondary structure identification image in the associated cell. In this manner, there is an alignment pattern created for each of the mask layers 12 with the first mask layer 14. As mentioned above, there are preferably such alignment patterns created at each of the four corner areas 36, 38, 40, and 42 of the first mask layer 14. Further, there would be similar alignment patterns created at the corner areas of each of the other mask layers 12 as well.

With the patterns as described above and depicted in FIG. 8, the overlay errors between the different mask layers 12 can be determined, and the measurements can be used to input correction factors into the stepper, such that the reticle 10 can then be used in a traditional manner, such as by closing the reticle blades to expose a single mask layer 12 image at a time, and the correction factors ensure that the various mask images 12 are properly aligned, one to another. In this manner, a production reticle 10 can be used to characterize the overlay errors, rather than having to fabricate and use a special test reticle to accomplish the characterization. Most preferably, dark field structures are used for the primary alignment structures and the secondary alignment structures, so that multiple exposures do not negatively impact the overprinting between the structures.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for characterizing overlay errors between at least a first and a second mask layer for an integrated circuit, the method comprising:
    forming a first primary alignment structure in a first position of an inter-layer region of the first mask layer,
    forming a first secondary alignment structure in a second position of the inter-layer region of the first mask layer,
    forming a second primary alignment structure in a first position of an inter-layer region of the second mask layer,
    forming a second secondary alignment structure in a second position of the inter-layer region of the second mask layer,
    exposing the first mask layer and the second mask layer onto a photoresist coated substrate with a first exposure,
    exposing the first mask layer and the second mask layer onto the photoresist coated substrate with a second exposure,
    where the first position of the first primary alignment structure during the first exposure generally aligns with the second position of the second secondary alignment structure, and the second position of the first secondary alignment structure during the second exposure generally aligns with the first position of the second primary alignment structure,
    developing the photoresist on the substrate, and
    measuring offsets between the first primary alignment structure and the second secondary alignment structure and between the second primary alignment structure and the first secondary alignment structure to determine the overlay errors.

2. The method of claim 1 wherein the overlay errors for more than two mask layers are characterized.

3. The method of claim 1 wherein the first and second mask layers are disposed on a common mask substrate.

4. The method of claim 1 wherein all of the alignment structures are dark field structures.

5. The method of claim 1 wherein the first primary alignment structure and the second primary alignment structure comprise outer box structures.

6. The method of claim 1 wherein the first secondary alignment structure and the second secondary alignment structure comprise inner box structures.

7. The method of claim 1 wherein the first positions of the inter-layer regions of the first mask layer and the second mask layer comprise four positions each near corners of each of the first mask layer and the second mask layer.

8. The method of claim 1 wherein the second positions of the inter-layer regions of the first mask layer and the second mask layer comprise four positions each near corners of each of the first mask layer and the second mask layer.

9. The method of claim 1 wherein:
    the step of exposing the first mask layer and the second mask layer with the first exposure comprises exposing the first mask layer and the second mask layer with a stepper having exposure site blades, where the exposure site blades are in a position allowing both the first mask layer and the inter-layer region around the first mask layer, and the second mask layer and the inter-layer region round the second mask layer to be exposed onto the substrate, and
    the step of exposing the first mask layer and the second mask layer with the second exposure comprises stepping the first mask layer and the second mask layer one position and exposing the first mask layer and the second mask layer onto the substrate on top of each other.

10. The method of claim 1 further comprising the step of using the overlay errors to correct future exposures of the first mask layer and the second mask layer.

11. A method for compensating for overlay errors between at least a first and a second mask layer for an integrated circuit, where the first and second mask layers are disposed on a common mask substrate, the method comprising:
    forming a first primary alignment structure in a first position of an inter-layer region of the first mask layer,
    forming a first secondary alignment structure in a second position of the inter-layer region of the first mask layer,
    forming a second primary alignment structure in a first position of an inter-layer region of the second mask layer,
    forming a second secondary alignment structure in a second position of the inter-layer region of the second mask layer,
    exposing the first mask layer and the second mask layer onto a photoresist coated substrate with a first exposure,
    exposing the first mask layer and the second mask layer onto the photoresist coated substrate with a second exposure,
    where the first position of the first primary alignment structure during the first exposure generally aligns with the second position of the second secondary alignment structure, and the second position of the first secondary alignment structure during the second exposure generally aligns with the first position of the second primary alignment structure,
    developing the photoresist on the substrate,
    measuring offsets between the first primary alignment structure and the second secondary alignment structure and between the second primary alignment structure and the first secondary alignment structure to determine the overlay errors, and
    using the overlay errors to compensate future exposures of the first mask layer and the second mask layer.

12. The method of claim 11 wherein the overlay errors for more than two mask layers are characterized.

13. The method of claim 11 wherein all of the alignment structures are dark field structures.

14. The method of claim 11 wherein the first primary alignment structure and the second primary alignment structure comprise outer box structures.

15. The method of claim 11 wherein the first secondary alignment structure and the second secondary alignment structure comprise inner box structures.

16. The method of claim 11 wherein the first positions of the inter-layer regions of the first mask layer and the second mask layer comprise four positions each near corners of each of the first mask layer and the second mask layer.

17. The method of claim 11 wherein the second positions of the inter-layer regions of the first mask layer and the second mask layer comprise four positions each near corners of each of the first mask layer and the second mask layer.

18. The method of claim 11 wherein:
the step of exposing the first mask layer and the second mask layer with the first exposure comprises exposing the first mask layer and the second mask layer with a stepper having exposure site blades, where the exposure site blades are in a position allowing both the first mask layer and the inter-layer region around the first mask layer, and the second mask layer and the inter-layer region around the second mask layer to be exposed onto the substrate, and
the step of exposing the first mask layer and the second mask layer with the second exposure comprises stepping the first mask layer and the second mask layer one position and exposing the first mask layer and the second mask layer onto the substrate on top of each other.

19. The method of claim 11 further comprising the step of using the overlay errors to correct future exposures of the first mask layer and the second mask layer.

20. Structures for overlay error characterization between a first mask layer and a second mask layer, the structures comprising:
a first primary alignment structure in a first position of an inter-layer region of the first mask layer,
a first secondary alignment structure in a second position of the inter-layer region of the first mask layer,
a second primary alignment structure in a first position of an inter-layer region of the second mask layer, and
a second secondary alignment structure in a second position of the inter-layer region of the second mask layer,
where the first position of the first primary alignment structure generally aligns with and overlays the second position of the second secondary alignment structure during a first exposure, and the second position of the first secondary alignment structure generally aligns with and overlays the first position of the second primary alignment structure during a second exposure.

* * * * *